United States Patent
Sakata et al.

(10) Patent No.: US 9,464,226 B2
(45) Date of Patent: Oct. 11, 2016

(54) LI-CONTAINING α-SIALON-BASED PHOSPHOR, PRODUCTION PROCESS THEREOF, LIGHTING DEVICE AND IMAGE DISPLAY DEVICE

(71) Applicant: Ube Industries, Ltd., Ube, Yamaguchi (JP)

(72) Inventors: Shin-chi Sakata, Yamaguchi (JP); Hiroshi Oda, Yamaguchi (JP); Takuma Sakai, Yamaguchi (JP)

(73) Assignee: Ube Industries, Ltd. (JP)

( * ) Notice: Subject to any disclaimer, the term of this patent is extended or adjusted under 35 U.S.C. 154(b) by 287 days.

(21) Appl. No.: 14/217,816

(22) Filed: Mar. 18, 2014

(65) Prior Publication Data

US 2014/0197362 A1    Jul. 17, 2014

Related U.S. Application Data

(63) Continuation of application No. 13/058,027, filed as application No. PCT/JP2009/064373 on Aug. 11, 2009, now abandoned.

(30) Foreign Application Priority Data

| Aug. 13, 2008 | (JP) | ................ | 2008-208569 |
| Aug. 13, 2008 | (JP) | ................ | 2008-208570 |
| Mar. 2, 2009 | (JP) | ................ | 2009-048453 |

(51) Int. Cl.

| C09K 11/08 | (2006.01) |
| C09K 11/77 | (2006.01) |
| H01L 33/50 | (2010.01) |

(52) U.S. Cl.
CPC ........ C09K 11/7728 (2013.01); C09K 11/0883 (2013.01); C09K 11/7734 (2013.01); H01L 33/502 (2013.01); Y02B 20/181 (2013.01)

(58) Field of Classification Search
CPC ................................................. C09K 11/7734
See application file for complete search history.

(56) References Cited

U.S. PATENT DOCUMENTS

| 7,906,040 | B2 | 3/2011 | Mitomo et al. |
| 7,910,023 | B2 | 3/2011 | Xie et al. |
| 8,125,139 | B2 | 2/2012 | Emoto et al. |
| 8,497,624 | B2 * | 7/2013 | Sakata ............... C09K 11/0883 252/301.4 R |
| 2008/0309220 | A1 | 12/2008 | Sakata et al. |
| 2009/0091237 | A1 | 4/2009 | Hirosaki et al. |
| 2009/0251044 | A1 | 10/2009 | Shioi |
| 2009/0284948 | A1 | 11/2009 | Yamao et al. |
| 2010/0072498 | A1 | 3/2010 | Xie et al. |

FOREIGN PATENT DOCUMENTS

| JP | 2002-363554 A | 12/2002 |
| JP | 2004-067837 A | 3/2004 |
| JP | 2005-307012 | 11/2005 |
| JP | 2006-052337 A | 2/2006 |
| JP | 2006-152069 A | 6/2006 |
| JP | 2006-321921 A | 11/2006 |
| WO | 2007/004493 A1 | 1/2007 |
| WO | 2008/004640 A1 | 1/2008 |

OTHER PUBLICATIONS

Rong-Jun Xie et al., "Optical Properties of $Eu^{2+}$ in α-Sialon," J. Phys. Chem., vol. 108, 2004, pp. 12027-12031.
Rong-Jun Xie et al., "Wavelength-tunable and thermally stable Li—α-sialon: $Eu^{2+}$ oxynitride phosphors for white light-emitting diodes," Applied Physics Letters, vol. 89, 2006, pp. 241103-1-241103-3.

* cited by examiner

*Primary Examiner* — Carol M Koslow
(74) *Attorney, Agent, or Firm* — DLA Piper LLP (US)

(57) ABSTRACT

An Li-containing α-sialon-based phosphor represented by the formula (1): $Li_xEu_ySi_{12-(m+n)}Al_{(m+n)}O_{n+\delta}N_{16-n-\delta}$ (wherein assuming that average valence of Eu is a, $x+ya+\delta=m$; $0.45 \leq x < 1.2$, $0.001 \leq y \leq 0.2$, $0.9 \leq m \leq 2.5$, $0.5 \leq n \leq 2.4$, and $\delta > 0$).

5 Claims, 3 Drawing Sheets

LI-CONTAINING α-SIALON-BASED PHOSPHOR, PRODUCTION PROCESS THEREOF, LIGHTING DEVICE AND IMAGE DISPLAY DEVICE

TECHNICAL FIELD

This disclosure relates to an optical functional material having a function of converting a part of irradiation light into light at a different wavelength, and a production process thereof. More specifically, this disclosure relates to a sialon-based phosphor activated by a rare earth metal element, which is suitable for an ultraviolet-to-blue light source. The disclosure also relates to a production process of the sialon-based phosphor, and a light emitting device and an image display device each using the same.

BACKGROUND

Recently, with practical implementation of a blue light-emitting diode (LED), development of a white LED utilizing the blue LED is being aggressively sought. The white LED ensures low power consumption and extended life compared with existing white light sources, and therefore its application to liquid crystal panel backlight, indoor or outdoor lighting device, and the like is expanding.

The white LED developed at present is obtained by coating a Ce-doped YAG (yttrium.aluminum.garnet) on a surface of a blue LED. However, the Ce-doped YAG has a fluorescence wavelength in the vicinity of 530 nm and when the color of this fluorescence and the light of a blue LED are mixed to provide white light, blue-tinted white light results and good white light cannot be obtained.

On the other hand, an α-sialon-based phosphor activated by a rare earth element is known to emit fluorescence with a longer wavelength than the fluorescence wavelength of Ce-doped YAG (see Japanese Unexamined Patent Publication (Kokai) No. 2002-363554). When a white LED is fabricated using fluorescence of such sialon, a white LED giving a bulb color at a lower color temperature than a white LED using YAG can be produced.

Also, in J. Phys. Chem., B2004, 108, 12027-12031, a sialon-based phosphor having a compositional formula represented by $M_xSi_{12-(m+n)}Al_{m+n}O_nN_{16-n}$ gives a maximum intensity at m=2.8, and a peak wavelength in the vicinity of 595 nm is obtained there. This fluorescence wavelength is suitable for a white LED with a low color temperature as in a bulb color, but a white LED with a high color temperature, such as daytime white color or daylight color higher in the color temperature, cannot be produced.

The daytime white color and daylight color have a wide range of applications including not only lighting but also backlight of a liquid crystal display device, etc., and their need is greater than that for bulb color. To meet this need, fluorescence with a shorter wavelength is required of the sialon-based phosphor. However, as understood from J. Phys. Chem., B2004, 108, 12027-12031, a Ca-containing α sialon phosphor is reduced in the fluorescence intensity when the fluorescence wavelength is shifted to the shorter wavelength side than 595 nm. Accordingly, it has been difficult to produce a sialon-based phosphor capable of emitting fluorescence at a short wavelength suitable for producing a high-luminance LED of daytime white color or daylight color by combining the phosphor with a blue LED.

To solve this problem, WO 2007/004493 A1 discloses a Li (lithium)-containing α-sialon-based phosphor. This sialon can emit fluorescence at a short wavelength compared with the Ca-containing α-sialon-based phosphor. However, in the disclosure above, the Li-containing α-sialon-based phosphor is obtained in an atmosphere under nitrogen pressure of 1 MPa and in view of a cumbersome production process or use of a production apparatus capable of withstanding a high-temperature high-pressure nitrogen gas, the phosphor is costly produce to. Also, x1 indicating the Li content in the above-described compositional formula of sialon is an abnormally large value of $1.2 \leq x1 \leq 2.4$, and a Li-containing α-sialon-based phosphor having a desired composition is difficult to produce with good reproducibility.

As for the report on a Li-containing α-sialon-based phosphor, Japanese Unexamined Patent Publication (Kokai) No. 2004-67837 is known in addition to WO '493, but the Li-containing α-sialon-based phosphor disclosed has a fluorescence wavelength of 585 nm and differs in the composition from the Li-containing α-sialon-based phosphor. With such a fluorescence wavelength, even when combined with a blue light-emitting diode, an LED of daytime white color or daylight color cannot be obtained.

Furthermore, in WO '493, the form or aggregation state of particles is not considered. In WO '493, a Li-containing α-sialon-based phosphor is produced using crystalline silicon nitride. In the case of a Ca-containing α-sialon-based phosphor, when crystalline silicon nitride is used, this forms a secondary particle where small primary particles are strongly aggregated (fused). Such a case is seen in FIGS. 1 to 8 of Japanese Unexamined Patent Publication (Kokai) No. 2006-152069. It is presumed that the same occurs in the case of a Li-containing α-sialon-based phosphor.

The form or aggregation state of particles of a phosphor powder affects light scattering, absorption and in turn, fluorescence intensity and furthermore, also affects the slurry properties when coating the phosphor. The slurry properties are an important factor in the production process.

The effect on the fluorescence intensity is described below. In a phosphor, irrespective of the size of a primary particles or secondary particles, when the particle size is reduced to about a submicron, light scattering is increased to lower the absorption and the fluorescence intensity is decreased. To avoid this, a method of producing large secondary particles by aggregating submicron primary particles may be considered. However, when such powder is pulverized or is subjected to various handlings, the submicron primary particles fall off, as a result, it is difficult to avoid the effect of the primary particles. Also, in the case of a secondary particle formed by aggregating small primary particles, fine irregularities are produced on the secondary particle surface, and this is considered to result in light scattering and a decrease in the fluorescence intensity.

In addition, when the aggregation to a secondary particle is firm, strong pulverization is required and incorporation of impurities from the pulverizer occurs. If a component participating in light absorption is immixed even in a small amount, the characteristics of the phosphor are greatly deteriorated, and therefore strong pulverization is not preferred.

Furthermore, when the particle size grows to tens of micron or more, this gives rise to color unevenness or the like at the time of fabricating a product such as white LED, and products with stable quality cannot be fabricated. On the other hand, to obtain a high-quality phosphor, i.e., a phosphor having high fluorescence intensity, a particle with high crystallinity is necessary. From this viewpoint, the primary particle is preferably a large crystal. The reason therefor is that when the crystal size is small, the fluorescence intensity decreases due to surface defects.

Considering these conditions, a phosphor with good characteristics is preferably a powder in which primary particles are distributed in the range of 1 to 20 μM without aggregation and the powder is composed of particles having a larger size in this particle size range.

In Japanese Unexamined Patent Publication (Kokai) Nos. 2002-363554 and 2006-321921, the primary particle size of Ca-containing α-sialon phosphor is already known, but studies on the primary particle of Li-containing α-sialon are not sufficiently made in JP '337 and JP '921. Despite the disclosure of JP '337 and JP '921, the growth of a primary particle of Li-containing α-sialon cannot be estimated to be the same as that of Ca-containing α-sialon, because Li is an easily evaporable element or the substance related to Li may form a compound having a relatively low melting point.

As regards the phosphor, a technique of using a flux is widely employed as a technique for regulating the form of primary particles. For growing a large primary particle, using a flux may also be considered in the Li-containing α-sialon. In WO '493, fluoride, chloride, iodide, bromide and phosphate of Li, Na, K, Mg, Ca, Sr, Ba, Al and Eu, particularly, lithium fluoride, calcium fluoride and aluminum fluoride, are pointed out as flux, but their effects are not specifically described, and the technique disclosed merely suggests a general technique.

It could therefore be helpful to provide a phosphor having high fluorescence intensity and emitting a fluorescence color making it possible to produce a white light-emitting diode of daytime white color or daylight color by combining the phosphor with a blue LED.

It could also be helpful to provide a Li-containing α-sialon phosphor powder having high fluorescence intensity and having excellent properties as a phosphor powder by controlling the primary particle of Li-containing α-sialon. Such a Li-containing α-sialon can produce a high-efficiency white light-emitting diode of daytime white color or daylight color by combining it with an ultraviolet-to-blue LED.

It could further be helpful to provide a lighting device such as white LED of daytime white color or daylight color by providing a Li-containing α-sialon-based phosphor having high fluorescence intensity and using an ultraviolet or blue LED as a light source.

It could yet further be helpful to achieve high luminance and stable color tone of an image evaluation device having an excitation source such as electron beam.

It could also be helpful to provide a novel production process where a sialon-based phosphor capable of emitting the above-described fluorescence color with high intensity can be obtained in a high yield.

SUMMARY

We found that a Li-containing α-sialon-based phosphor having a specific composition and being producible in an atmosphere of nitrogen gas under atmospheric pressure can realize excellent fluorescence intensity and short fluorescence wavelength.

We also found that when a nitrogen-containing silane compound and/or an amorphous silicon nitride powder are used as starting materials, a Li-containing α-sialon phosphor having a large primary particle size, allowing for little aggregation of primary particles with each other and exhibiting a weak cohesive force can be obtained. Moreover, this phosphor has higher fluorescence intensity than that produced using crystalline silicon nitride.

We further found that in the case of an α-sialon-based phosphor containing Li and Eu, a Li-containing α-sialon having a large primary particle size can be obtained. We also found that in this method, a Li-containing α-sialon-based phosphor powder capable of emitting fluorescence at a shorter wavelength can be obtained and the fluorescence intensity thereof is high as compared with those produced by an ordinary method.

In this way, we provide the following.

An Li-containing α-sialon-based phosphor represented by formula (1):

$$Li_xEu_ySi_{12-(m+n)}Al_{(m+n)}O_{n+\delta}N_{16-n-\delta} \tag{1}$$

(wherein assuming that the average valence of Eu is a, $x+ya+\delta=m$; $0.45 \le x < 1.2$, $0.001 \le y \le 0.2$, $0.9 \le m \le 2.5$, $0.5 \le n \le 2.4$, and $\delta > 0$).

Preferably, we provide the Li-containing α-sialon-based phosphor above, wherein the δ is from 0.05 to 1.2 and the ratio x/m between x and m is from 0.4 to 0.9. Furthermore, a preferred Li-containing α-sialon-based phosphor above has x of $0.82 \le x < 1.2$ and the x/m of from 0.5 to 0.9.

In the Li-containing α-sialon-based phosphor, it is preferred that the x is $0.91 \le x < 1.2$ and the x/m is from 0.6 to 0.9. Also, we provide the Li-containing α-sialon-based phosphor above, wherein fluorescence having a peak wavelength of 560 to 580 nm is emitted by injecting excitation light.

A lighting device comprises a light emitting source and a phosphor containing the Li-containing α-sialon-based phosphor above. The light emitting source is preferably an LED capable of emitting light at a wavelength of 330 to 500 nm. In one example of the lighting device, the phosphor further contains a phosphor capable of emitting a red color at 600 to 650 nm.

An image display device comprises an excitation source and a phosphor containing the Li-containing α-sialon-based phosphor above. In one example of the image display device, the excitation source is an electron beam, an electric field, a vacuum ultraviolet, or an ultraviolet ray.

A production process of the Li-containing α-sialon-based phosphor above comprises weighing and mixing a silicon nitride powder and/or a nitrogen-containing silane compound, an AlN-containing substance working out to an aluminum source, a nitride, oxynitride or oxide of Li or a precursor substance capable of becoming an oxide of Li by pyrolysis, and a nitride, oxynitride or oxide of Eu or a precursor substance capable of becoming an oxide of Eu by pyrolysis, to give a composition containing lithium in excess over the desired composition of the Li-containing α-sialon-based phosphor represented by formula (1), and firing the mixture at 1,400 to 1,800° C. in a nitrogen-containing inert gas atmosphere under atmospheric pressure. In the production process of the Li-containing α-sialon-based phosphor, the Li-containing α-sialon-based phosphor after firing is preferably subjected to acid washing.

A production process of the Li-containing α-sialon-based phosphor is as above, wherein an amorphous silicon nitride powder is used as the silicon nitride powder.

Preferably, the Li-containing α-sialon-based phosphor powder is the Li-containing α-sialon-based phosphor represented by formula (1), wherein the average aspect ratio of the primary particle as measured by the image analysis of the scanning electron micrograph is 2 or less and the average particle diameter $D_{particle}$ is from 1 to 3.0 μm.

Also, preferably, the Li-containing α-sialon-based phosphor powder above has particles measured by the image analysis of the scanning electron micrograph, a primary particle of 0.8 μm or more is present in an area ratio of 70% or more. Furthermore, the Li-containing α-sialon-based phosphor powder above has a frequency distribution curve in the particle size distribution curve measured by a laser diffraction/scattering particle size distribution measuring apparatus is a single peak and the median diameter is from 4 to 15 μm.

Also, the Li-containing α-sialon-based phosphor powder above has a 10% diameter in the particle size distribution curve of 1.5 μm or more and the 90% diameter is 15 μm or less.

Also, the Li-containing α-sialon-based phosphor powder above has fluorescence having a peak wavelength of 560 to 580 nm is emitted by injecting excitation light.

Also, a lighting device comprises a light emitting source and a phosphor containing the Li-containing α-sialon-based phosphor powder above. The light emitting source is preferably an LED capable of emitting light at a wavelength of 330 to 500 nm. In another example of the phosphor, the phosphor may contain a phosphor capable of emitting a red color at 600 to 650 nm.

Also, a production process of the Li-containing α-sialon-based phosphor powder above comprises weighing and mixing an amorphous silicon nitride powder and/or a nitrogen-containing silane compound, an AlN-containing substance working out to an aluminum source, a nitride, oxynitride or oxide of Li or a precursor substance capable of becoming an oxide of Li by pyrolysis, a nitride, oxynitride or oxide of Eu or a precursor substance capable of becoming an oxide of Eu by pyrolysis, to give a composition containing lithium in excess over the desired composition of the Li-containing α-sialon-based phosphor represented by formula (1), and firing the mixture at 1,400 to 1,800° C. in a nitrogen-containing inert gas atmosphere under atmospheric pressure.

Preferably, a Li-containing α-sialon-based phosphor particle is the Li-containing α-sialon-based phosphor represented by formula (1), wherein the aspect ratio of the primary particle as measured by the image analysis of the scanning electron micrograph is 3 or less and the length of the short axis is more than 3 μm.

Furthermore, a production process of the Li-containing α-sialon-based phosphor powder above comprises mixing an amorphous silicon nitride powder and/or a nitrogen-containing silane compound, an AlN-containing substance working out to an aluminum source, a nitride, oxynitride or oxide of Li or a precursor substance capable of becoming an oxide of Li by pyrolysis, a nitride, oxynitride or oxide of Eu or a precursor substance capable of becoming an oxide of Eu by pyrolysis, each in a theoretical amount giving the composition of formula (1), and an oxide of Li or a precursor substance capable of becoming an oxide of Li by pyrolysis, in an amount higher than the theoretical amount, and firing the mixture at 1,500 to 1,800° C. in a nitrogen-containing inert gas atmosphere under atmospheric pressure.

The amount of metal lithium in the oxide of Li or the precursor substance may be capable of becoming an oxide of Li by pyrolysis, mixed in excess over the theoretical amount, is preferably from 0.1 to 1.25 mol per mol of the Li-containing α-sialon-based phosphor as a product by the theoretical amount.

A lighting device comprises a light emitting source and a phosphor containing the Li-containing α-sialon-based phosphor represented by formula (1). The light emitting source is an LED capable of emitting light at a wavelength of 330 to 500 nm.

The Li-containing α-sialon-based phosphor is designed to have a specific composition by adjusting the Li content of the product, whereby a lighting device such as white LED exhibiting conventionally unobtainable high fluorescence intensity and emitting a daytime white color or daylight color when using an ultraviolet or blue LED as a light source can be provided.

Preferably, amorphous silicon nitride and/or a nitrogen-containing silane compound is used as the starting material to give a Li-containing α-sialon-based phosphor particle having a specific particle form and the Li content of the product is adjusted to give a Li-containing α-sialon-based phosphor particle having a specific composition, whereby a phosphor exhibiting conventionally unobtainable high fluorescence intensity can be obtained.

Preferably, a Li-containing α-sialon phosphor having an unprecedentedly large primary particle size can be obtained. The Li-containing α-sialon phosphor exhibits high fluorescence intensity and, at the same time, has excellent properties as a phosphor powder.

Also, by using this phosphor powder, a high-luminance lighting device such as white LED capable of emitting a daytime white color or a daylight color when using an ultraviolet or blue LED as a light source can be provided.

BRIEF DESCRIPTION OF THE DRAWINGS

FIGS. 1A and 1B are SEM photographs showing the state in one example of the powder after acid treatment in Example 2 and Example 6.

FIGS. 2A and 2B are SEM photographs showing one example of the phosphor powder after pulverization in Example 2 and Example 6.

DETAILED DESCRIPTION

Our disclosure is described in detail below.

The Li-containing α-sialon-based phosphor is represented by formula (1):

$$Li_xEu_ySi_{12-(m+n)}Al_{(m+n)}O_{n+\delta}N_{16-n-\delta} \quad (1)$$

wherein assuming that the average valence of Eu is a, $x+ya+\delta=m$ (provided that $\delta>0$).

The Li-containing α-sialon-based phosphor is characterized by the content of Li. That is, we found that the Li-containing α-sialon-based phosphor obtained through firing in a nitrogen-containing inert gas atmosphere under atmospheric pressure has a great difference in the Li content between the charge composition and the composition of the synthesis product obtained. Li is an easily evaporable ele- ment and evaporation occurs during firing, as a result, the Li content in the Li-containing α-sialon-based phosphor obtained after acid washing becomes small. Evaporation of Li is significant particularly when firing under atmospheric pressure or under reduced pressure and by investigating in detail the correlation between the charge composition and the composition of the synthesis product obtained, it has been found that when in the above-described compositional formula of Li-containing α-sialon, δ is from 0.05 to 1.2 and the ratio x/m between x and m is from 0.4 to 0.9, a phosphor identified as a substantially single-phase Li-containing α-sialon-based phosphor by the X-ray diffraction pattern can be obtained. We are the first to indicate that in the Li compositional region of the Li-containing α-sialon-based phosphor, both excellent fluorescence intensity and shorter fluorescence wavelength can be achieved.

The Li-containing α-sialon-based phosphor is synthesized by performing acid washing after firing at 1,400 to 2,000° C. in an inert gas atmosphere under a pressure of 0.08 to 0.9 MPa. As for the firing atmosphere, the firing is preferably carried in a nitrogen atmosphere under atmospheric pressure. In particular, the production cost of the Li-containing α-sialon-based phosphor can be reduced by performing the synthesis in a nitrogen-containing inert gas atmosphere under atmospheric pressure. We synthesized Li-containing α-sialon-based phosphors having various compositions in a nitrogen atmosphere under atmospheric pressure and discovered compositional features with respect to fluorescence characteristics of the Li-containing α-sialon-based phosphor obtained after acid washing. As a result, a Li-containing α-sialon-based phosphor satisfying both excellent fluorescence intensity and shorter fluorescence wavelength can be synthesized for the first time by firing in a nitrogen atmosphere under atmospheric pressure.

Furthermore, the Li-containing α-sialon-based phosphor is characterized, as described above, in that x+ya+δ=m (provided that δ>0) and x+ya is smaller than m. a is the average valence of Eu, but the valence of Eu varies depending on the temperature and the oxygen partial pressure in the atmosphere. It is considered that trivalent Eu is stable at room temperature and only $Eu_2O_3$ is known as an oxide thereof, but when the temperature rises, rather divalent Eu becomes stable and Eu is reduced to divalent Eu at high temperature in a nitrogen atmosphere and solid-dissolved as $Eu^{2+}$ in the crystal lattice of α-sialon. As disclosed in paragraph 0065 at page 14 of WO '493, in all of documents and patent publications heretofore reported, the compositional formula of α-sialon is composed by regarding Eu as divalent. Accordingly, in the composition of the Li-containing α-sialon, δ is calculated on the condition that the valence of Eu is divalence.

The amount of metal solid-dissolved is m/[valence of metal] in all conventional sialons and the Li-containing α-sialon-based phosphor compositions in conventional techniques all satisfy the relational expression of x+ya=m. On the other hand, the Li-containing α-sialon-based phosphor is characterized in that the content of Al is larger than in the conventional composition and the chemical composition is represented by formula (1). As a result of the condition that x+ya is smaller than m, the ratio between Si atom and Al atom constituting the Li-containing α-sialon-based phosphor varies and, at the same time, the proportion of oxygen atom and the proportion of nitrogen atom are varied.

Due to compositional change of constituent atoms in such a Li-containing α-sialon-based phosphor, charge shift may be caused. In this case, the charge balance may be compensated for by a defect produced in the Li-containing α-sialon-based phosphor. In the crystal lattice of α-sialon, a network composed of cation (Si, Al)-anion (O, N)-cation (Si, Al)-anion (O, N)- is present and a metal element such as Li and Eu intrudes and exists as a solid solution in gaps in the network. When a vacancy is produced on the cation site, the proportion of oxygen or nitrogen atom on the anion site is relatively increased, whereas when a vacancy is produced on the anion site, the proportion of oxygen or nitrogen atom on the anion site is relatively decreased. Therefore, the chemical composition is more generally represented by the following formula (2):

$$Li_xEu_ySi_{12-(m+n)}Al_{(m+n)}O_{n+\epsilon}N_{16-n-\phi} \quad (2)$$

wherein assuming that the average valence of Eu is a, x+ya+δ=m and δ=3φ−2ε and wherein (n+ε) indicates the number of oxygen atoms occupying the anion site and (16−n−φ) indicates the number of nitrogen atoms occupying the anion site, provided that δ>0, −δ/2≤ε≤δ/2, and −δ/3≤φ≤δ/3.

When it is tried to synthesize sialon with x+ya being equal to m by increasing Li in raw materials, production of a heterophase occurs and a single-phase Li-containing α-sialon-based phosphor cannot be obtained. The Li-containing α-sialon-based phosphor produced by the process is obtained based on the finding that stable sialon results when x+ya is not equal to m. Focusing on equalizing x+ya with m leads to a rise in cost such as synthesis in a high-pressure nitrogen gas and also disadvantageously suffers from poor reproducibility.

The compositional range giving a single-phase Li-containing α-sialon-based phosphor is, in formula (1) of a Li-containing α-sialon-based phosphor, 0.45≤x<1.2, preferably 0.82≤x<1.2, more preferably 0.91≤x<1.2. If x is less than 0.45, the fluorescence intensity decreases, whereas if it is 1.2 or more, a heterophase is produced and a single-phase α-sialon-based phosphor cannot be obtained. In particular, the compositional range satisfying both short wavelength and fluorescence intensity is 0.82≤x<1.2. The wavelength of fluorescence shifts to short wavelength with an increase in the Li content and can be varied in the range of, in terms of peak wavelength, from 560 to 580 nm.

Also, the Li-containing α-sialon-based phosphor is characterized by δ>0 and, particularly, when δ is from 0.05 to 1.2 and the ratio x/m between x and m is from 0.5 to 0.9, this is preferred because high fluorescence intensity is obtained. It is more preferred that δ is from 0.05 to 1.0 and the x/m ratio is from 0.6 to 0.9.

Eu is an element which is solid-dissolved in the Li-containing α-sialon-based phosphor and works out to a light emitting source and, in formula (1), y is preferably 0.001≤y≤0.2. If y is less than 0.001, the content of the light emitting source is reduced and a bright phosphor cannot be obtained. Also, if it exceeds 0.2, a sialon emitting fluorescence at a short wavelength cannot be obtained. A preferred range is 0.01≤y≤0.15, and a more preferred range is 0.01≤y≤0.1.

m and n are 0.9≤m≤2.5 and 0.5≤n≤2.4. m is a value determined so as to keep electrical neutrality when a metal element is solid-dissolved in sialon, and m=x+ya+δ. a is the average valence of Eu. The number of Al atoms substituted for Si atom excessively over the number of Al atoms substituted on the cation site corresponding to the number of metal elements (Li and Eu) intruded and existing as a solid solution in the network composed of cation (Si, Al)-anion (O, N)-cation (Si, Al)-anion (O, N)-constituting α-sialon is denoted as δ (in this disclosure, δ>0). If m is less than 0.9, the sialon crystal is hardly stabilized due to the small solid solution amount of metal elements (Li and Eu) and the fluorescence intensity of the phosphor may decrease, whereas if the m value exceeds 2.5, a crystal phase other than sialon is readily produced. m is preferably 0.9≤m≤2.5. n is the value related to the substitution solid-solution amount of oxygen in the Li-containing α-sialon-based phosphor. If the n value is less than 0.5 or (n+δ) is less than 0.55, the sialon crystal is hardly stabilized due to the small solid solution amount of metal elements (Li and Eu) and the fluorescence intensity may decrease, whereas if the n value exceeds 2.4 or (n+δ) exceeds 3.2, a crystal phase other than sialon is readily produced. Preferred ranges are 1.0≤m≤2.1, 1.4≤n≤2.4 and 1.8≤n+δ≤3.1, and more preferred ranges are 1.1≤m≤2.0, 1.55≤n≤2.3 and 1.9≤n+δ≤3.0.

The term "heterophase" as used herein is a heterophase identified by the diffraction pattern of X-ray diffraction and excludes a component not appearing in the X-ray diffraction, such as glass.

The production process of the sialon-based phosphor powder is described below.

The Li-containing α-sialon-based phosphor powder can be obtained by weighing and mixing a silicon nitride powder, an AlN-containing substance working out to an aluminum source, a nitride, oxynitride or oxide of Li or a precursor substance capable of becoming an oxide of Li by pyrolysis, and a nitride, oxynitride or oxide of Eu or a precursor substance capable of becoming an oxide of Eu by pyrolysis, to give a composition containing lithium in excess over the desired composition of the Li-containing α-sialon-based phosphor, and firing the mixture at 1,400 to 2,000° C. in a nitrogen-containing inert gas atmosphere under atmospheric pressure. The obtained powder is washed with an acid solution to remove a glass component and the like attached to the surface, whereby a phosphor powder composed of substantially a single phase of Li-containing α-sialon-based phosphor can be finally obtained.

The amount of the Li compound as a raw material is increased so as to prevent the Li content of the obtained Li-containing α-sialon-based phosphor from becoming too small, because Li readily evaporates.

As the raw material silicon nitride powder, amorphous silicon nitride or a nitrogen-containing silane compound and/or an amorphous silicon nitride powder may be used.

Examples of the nitrogen-containing silane compound which can be used include silicon diimide ($Si(NH)_2$) and silicon nitrogen imide ($Si_2N_2NH$). Also, such a compound may be used by mixing it with a silicon nitride powder.

The nitrogen-containing silane compound and/or amorphous silicon nitride compound, which are a main raw material, can be obtained by a known method, for example, by decomposing an Si—N—H-based precursor compound such as silicon diimide produced through the reaction of a silicon halide such as silicon tetrachloride, silicon tetrabromide and silicon tetraiodide with ammonia in a gas phase or liquid phase state, under heating at 600 to 1,200° C. in a nitrogen or ammonia gas atmosphere. The crystalline silicon nitride powder can be obtained by firing the obtained nitrogen silane compound and/or amorphous silicon nitride powder at 1,300 to 1,550° C. The crystalline silicon nitride can also be obtained by directly nitriding a metal silicon in a nitrogen atmosphere, but this method requires a pulverization step to obtain a fine powder and, therefore, readily allows for mingling of impurities. For this reason, a method of decomposing a precursor, where a high-purity powder can be easily obtained, is preferably employed.

As for the nitrogen-containing silane compound and/or amorphous silicon nitride powder and the crystalline silicon nitride powder, a material having an oxygen content of 1 to 5 mass % is used. A material having an oxygen content of 1 to 3 mass % is preferred. If the oxygen content is less than 1 mass %, it becomes very difficult to produce an α-sialon phase by the reaction in the firing process and remaining of a crystal phase of the starting material or production of MN polytypes such as 21R is disadvantageously liable to occur, whereas if the oxygen content exceeds 5 mass %, the proportion of β-sialon or oxynitride glass produced increases, though the α-sialon production reaction is accelerated.

Also, as for the nitrogen-containing silane compound and/or amorphous silicon nitride powder, a material having a specific surface area of 80 to 600 $m^2/g$ is preferably used. A material having a specific surface area of 340 to 500 $m^2/g$ is more preferred. In the case of crystalline silicon nitride, a raw material having a specific surface area of 1 to 15 $m^2/g$ is preferably used.

The substance working out to the aluminum source includes aluminum oxide, metal aluminum and aluminum nitride, and these powders each may be used alone or may be used in combination. As for the aluminum nitride powder, a general powder having an oxygen content of 0.1 to 8 mass % and a specific surface area of 1 to 100 $m^2/g$ can be used.

The precursor substance capable of becoming an oxide of Li or Eu includes respective metal salts such as carbonate, oxalate, citrate, basic carbonate and hydroxide.

The amount of metal impurities other than the constituent components of the Li-containing α-sialon-based phosphor is preferably 0.01 mass % or less. In particular, as for the nitrogen-containing silane compound and/or amorphous silicon nitride powder, and/or the crystalline silicon nitride, which are added in a large amount, as well as aluminum oxide and AlN, the content of metal impurities in the material used is 0.01 mass % or less, preferably 0.005 mass % or less, more preferably 0.001 mass %. As for the oxide of metal Li or the precursor substance capable of becoming an oxide of Li by pyrolysis and the oxide of metal Eu or the precursor capable of becoming an oxide of Eu by pyrolysis, use of a material giving an oxide having a metal impurity content of 0.01 mass % or less is also preferred.

The method for mixing respective starting materials described above is not particularly limited, and a known method, for example, a method of dry mixing the materials, and a method of wet mixing the materials in an inert solvent which is substantially incapable of reacting with respective components of the raw material, and then removing the solvent, may be employed. A mixing device such as a V-type mixer, rocking mixer, ball mill, vibration mill and medium stirring mill may be used. However, the nitrogen-containing silane compound and/or amorphous silicon nitride powders are highly sensitive to moisture and humidity and, therefore, the mixing of starting materials must be performed in a controlled inert gas atmosphere.

The mixture of starting materials is fired at 1,400 to 1,800° C., preferably at 1,500 to 1,700° C., in a nitrogen-containing inert gas atmosphere under atmosphere pressure to obtain the desired Li-containing α-sialon-based phosphor powder. Examples of the inert gas include helium, argon, neon and krypton, but such a gas may also be used by mixing it with a small amount of hydrogen gas. If the firing temperature is less than 1,400° C., an impracticably long period of heating is required for the production of the desired Li-containing α-sialon-based phosphor powder, and the proportion of Li-containing α-sialon-based phosphor phase in the powder produced is also reduced. If the firing temperature exceeds 1,800° C., there arises an undesirable problem that silicon nitride and sialon are sublimated and decomposed to produce free silicon.

The heating furnace used for firing of the powder mixture is not particularly limited and, for example, a high-frequency induction heating- or resistance heating-system batch-type electric furnace, a rotary kiln, a fluidizing firing furnace and a pusher-type electric furnace may be used. As for the firing crucible, a BN-made crucible, a silicon nitride-made crucible, a graphite-made crucible and a silicon carbide-made crucible may be used. In the case of a graphite-made crucible, the inner wall is preferably coated with silicon nitride, boron nitride and the like.

In the thus-obtained Li-containing α-sialon-based phosphor, a glass layer is attached to the surface and for obtaining a phosphor having a higher fluorescence intensity, the glass layer is preferably removed. The easiest way to remove the glass layer on the phosphor particle surface is washing with an acid, i.e., a treatment of placing the sialon particle in the solution of an acid selected from sulfuric acid, hydrochloric acid and nitric acid and removing the glass layer on the surface. The concentration of the acid solution is from 0.1 to 7 N, preferably from 1 to 3 N. If the concentration is excessively high, oxidation aggressively proceeds and good fluorescence characteristics cannot be obtained. In an acid solution whose concentration is adjusted, the sialon-based phosphor powder is placed in an amount of 5 wt % based on the solution and kept for a desired time with stirring. After the washing, the solution containing the sialon-based phosphor powder is filtered, washed with water to flush out the acid, and dried.

Preferably, the Li-containing α-sialon phosphor is characterized by the size and crystal form of the particle constituting the phosphor, in addition to the above-described compositional features.

The Li-containing α-sialon-based phosphor powder may have a compositional feature of having the above-described Li content and a feature of producing the phosphor powder by using an amorphous silicon nitride powder and a nitrogen-containing silane compound as raw materials and is obtained by weighing and mixing an amorphous silicon nitride powder and/or a nitrogen-containing silane compound, an Al source, a Li source and a Eu source to give a composition containing lithium in excess over the desired composition of the Li-containing α-sialon-based phosphor represented by formula (1), and firing the mixture in a nitrogen-containing inert gas atmosphere under atmospheric pressure.

Figure 1A:
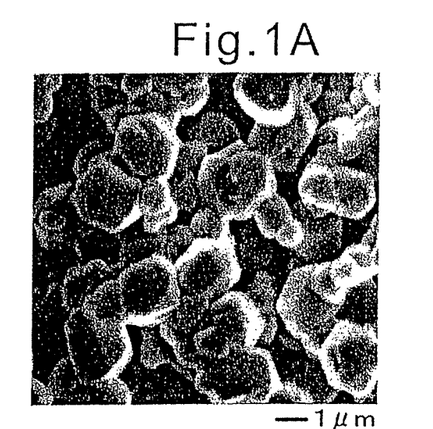
FIG. 1A is an SEM photograph of a Li-containing α-sialon-based phosphor powder produced using amorphous silicon nitride as a raw material.
Figure 1B:
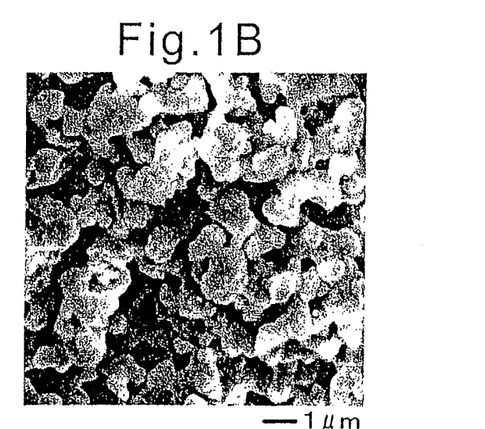
FIG. 1B is an SEM photograph of a Li-containing α-sialon-based phosphor powder produced using crystalline silicon nitride as a raw material.

Due to use of an amorphous silicon nitride powder and a nitrogen-containing silane compound as raw materials, the Li-containing α-sialon-based phosphor powder may come to have the below-described characteristic form and aggregation state of particles. FIGS. 1A and 1B are scanning electron microscope (SEM) photographs showing the state of the powder after acid treatment of the Li-containing α-sialon-based phosphor particles obtained in Example 2 and Example 6 according to this example, where a part of secondary particles each formed by fusion/aggregation of primary particles is being observed. FIG. 1A is an SEM photograph of Li-containing α-sialon-based phosphor particles using amorphous silicon nitride as a raw material, and FIG. 1B is an SEM photograph of Li-containing α-sialon-based phosphor particles using crystalline silicon nitride as a raw material. In FIG. 1A, it is seen that the phosphor is composed of particles of 1 to 2 μm. These are an automorphic primary particle of the Li-containing α-sialon-based phosphor particle. In FIG. 1B, it is seen that the phosphor is composed of particles of 0.5 to 1.3 μm. This particle is a secondary particle resulting from aggregation of several Li-containing α-sialon-based phosphor particle crystals, and a crystal exhibiting automorphism is scarcely observed.

Figure 2A:
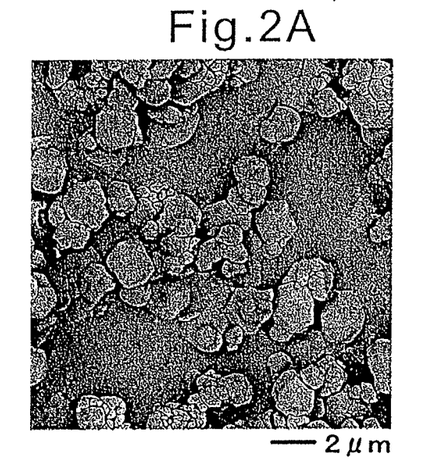
FIG. 2A is an SEM photograph of a Li-containing α-sialon-based phosphor powder produced using amorphous silicon nitride as a raw material.
Figure 2B:
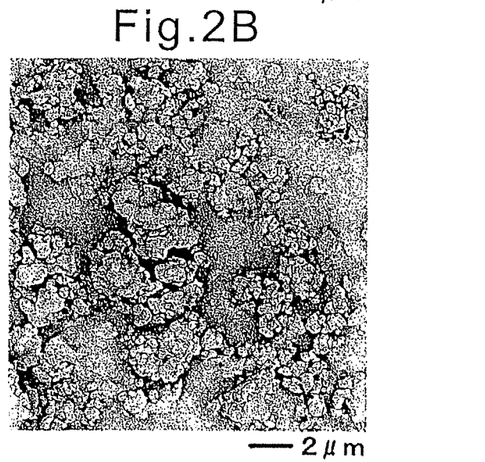
FIG. 2B is an SEM photograph of a Li-containing α-sialon-based phosphor powder produced using crystalline silicon nitride as a raw material.
Figure 3A:
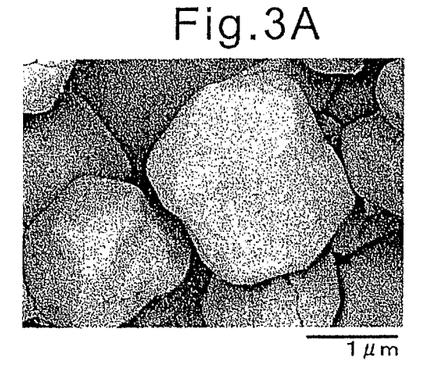
FIGS. 3A and 3B are enlarged photographs of FIGS. 2A and 2B.
Figure 3B:
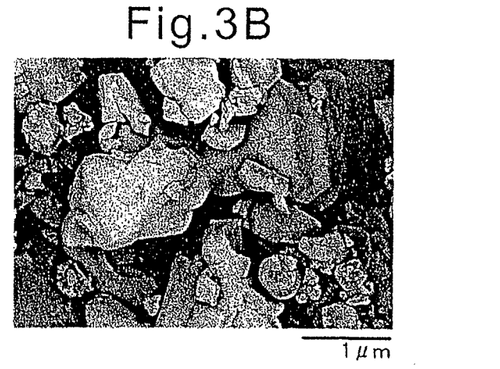

FIGS. 2A, 2B, 3A and 3B are SEM photographs showing representative examples when the particles above are pulverized into a state usable as a phosphor powder. FIG. 2A is an SEM photograph of a Li-containing α-sialon-based phosphor powder produced using amorphous silicon nitride as a raw material, and FIG. 2B is an SEM photograph of a Li-containing α-sialon-based phosphor powder produced using crystalline silicon nitride as a raw material. FIGS. 3A and 3B are enlarged photographs of FIGS. 2A and 2B. In FIG. 2A which is a Li-containing α-sialon-based phosphor powder produced using amorphous silicon nitride as a raw material, a large number of six-sided prismatic or six-sided pyramidal primary particles having a particle size of 1 to 1.5 μm are present and fine particles are scarcely observed. The size of the primary particle diameter varies depending on the composition and the firing conditions, but the results of image analysis of the SEM photograph reveal that in our range, the average particle diameter $D_{particle}$ is from 1.0 to 3.0 μm. Production of a particle having an average particle diameter larger than the range above requires an extremely long time for the firing process and this is not practical. Also, an average particle diameter of 0.5 μm or less has no difference from that of particles produced using a crystalline material. Furthermore, as seen also from the SEM photographs, the aspect ratio of particles constituting the Li-containing α-sialon-based phosphor powder is 2 or less.

FIG. 2B is an SEM photograph of a Li-containing α-sialon-based phosphor particle using crystalline silicon nitride as a raw material.

The Li-containing α-sialon-based phosphor powder in this example is characterized by a large primary particle and allows for little fusion/aggregation of primary particles with each other. However, all particles are not so, and production of a small particle also occurs. Preferably, as a result of measurement, the existence area of particles of 0.8 μm or more was 70% or more based on the total area of all particles in the measurement range. As this area is larger, the phosphor is better and as the area is smaller, reduction in the fluorescence intensity may occur.

In FIG. 2B which is a powder using crystalline silicon nitride as a raw material, an automorphic primary particle is not present. As seen from FIG. 3B, a particle having a size of 1 to 1.3 μm is a particle resulting from primary particles of about 0.5 μm being tightly fused. Also, many crystals of fine particle of 0.5 μm or less are present. In such powder, light scattering due to a small particle is increased and the fluorescence intensity decreases.

Figure 4A:
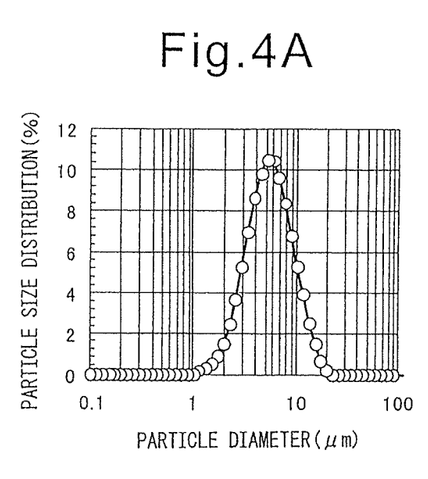
FIG. 4A is a particle size distribution (frequency distribution curve) chart of the Li-α-sialon phosphor powder obtained in Example 2.
Figure 4B:
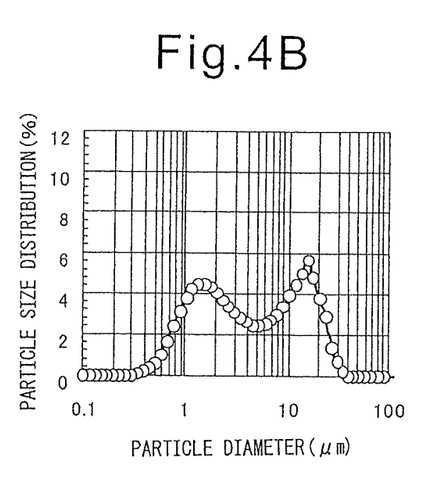
FIG. 4B is a particle size distribution chart of the phosphor powder obtained in Example 6 using crystalline silicon nitride as a raw material.

The difference in the existence mode between particles shown in FIGS. 2A and 2B appears as the difference in the particle size distribution. FIG. 4A shows a particle size distribution (frequency distribution curve) of the Li-containing α-sialon phosphor powder measured by a laser diffraction/scattering particle size distribution measuring apparatus, and FIG. 4B shows a particle size distribution when using crystalline silicon nitride. This frequency distribution curve is drawn by evenly dividing the zones of sufficiently large particle (about 1,000 μm) and sufficiently small particle (about 0.02 μm) into 80 sections with a log-scale and determining the frequency on a particle volume basis. In FIG. 4A, a particle size distribution having a single peak with the peak appearing in the vicinity of 5 μm is shown. Such a particle size distribution is very preferred as a phosphor. The Li-containing α-sialon-based phosphor powder may be weak in the fusion/aggregation and, therefore, a powder having a median diameter of 4 to 15 μm and showing a single peak can be obtained by weak pulverization. The shape of the single peak is important, because the median diameter can be varied by the degree of pulverization but the peak shape is dependent on the primary particle size in the secondary particle.

On the other hand, in the case of using crystalline silicon nitride as a raw material, the particle size distribution gives a particle size distribution curve having two peaks at 1.5 μm and 15 μm, revealing that when amorphous silicon nitride is used as a raw material, the properties of the powder obtained are more excellent. As seen from FIG. 3B, in this case, small primary particles are aggregated to form a secondary particle, and it is considered that the powder is resulting from breakage of this particle and, therefore, has the above-described two peaks.

The cause of producing a difference in the form and aggregation state of particles between using amorphous silicon nitride and/or nitrogen-containing silane compound and using crystalline silicon nitride for the raw material is described below.

The nucleation and growth of a Li-containing α-sialon-based phosphor particle are thought to occur in a glass phase of Li—Al—Si—O—N system produced in raw materials in the course of temperature rising. The amorphous silicon nitride or nitrogen-containing silane compound is an ultra-fine powder having a particle diameter of approximately from several nm to 10 nm and is very bulky. Since this is a main component, it is believed that other components can be uniformly dispersed therein and a fine glass phase is uniformly formed at a low temperature. The components of the Li-containing α-sialon-based phosphor are considered to dissolve in the glass phase, allowing the nucleation and growth to proceed stepwise and, in turn, enabling growth of a Li-containing α-sialon-based phosphor particle having a large particle diameter and exhibiting automorphism. Combined with high bulkiness, each particle independently grows and, therefore, fusion/aggregation scarcely takes place.

On the other hand, the crystalline silicon nitride, even a fine particle, has a particle diameter of about 0.2 μm and compared with the amorphous silicon nitride or nitrogen-containing silane compound, the particle size is very large. Therefore, uniform contact with Li, Al, O and N forming a glass phase cannot be ensured and in turn, a glass phase is thought to be produced locally. Also, the number of glass particles produced is estimated to be small. Since the particle diameter of existing silicon nitride is large, the raw material does not dissolve in the glass phase but the reaction to a Li-containing α-sialon-based phosphor proceeds allowing glass to be present by covering the silicon nitride particle surface. In such an existence mode of glass phase, a glass phase is shared by a large number of crystal nuclei and the growth proceeds competitively or simultaneously. As a result, a secondary particle in which primary particles are strongly fused/aggregated with each other is considered to be formed.

A preferred production process of the Li-containing α-sialon-based phosphor powder is described below. The Li-containing α-sialon-based phosphor powder can be obtained by weighing and mixing an amorphous silicon nitride powder and/or a nitrogen-containing silane compound, an AlN-containing substance working out to an aluminum source, a nitride, oxynitride or oxide of Li or a precursor substance capable of becoming an oxide of Li by pyrolysis, and a nitride, oxynitride or oxide of Eu or a precursor substance capable of becoming an oxide of Eu by pyrolysis, to give a composition containing lithium in excess over the desired composition of the Li-containing α-sialon-based phosphor, and firing the mixture at 1,400 to 2,000° C. in a nitrogen-containing inert gas atmosphere under atmospheric pressure. The obtained powder is washed with an acid solution to remove a glass component and the like attached to the surface, whereby a phosphor powder composed of substantially a Li-containing α-sialon-based phosphor can be finally obtained.

The production process of the Li-containing α-sialon-based phosphor powder may be the same as the above-described production process of the Li-containing α-sialon-based phosphor powder except for using, as the silicon nitride powder, an amorphous silicon nitride powder and/or a nitrogen-containing silane compound instead of a crystalline silicon powder.

Examples of the raw material nitrogen-containing silane compound which can be used include silicon diimide ($Si(NH)_2$) and silicon nitrogen imide ($Si_2N_2NH$). Also, a mixture of a nitrogen-containing silane compound and an amorphous silicon nitride powder may be used.

The Li-containing α-sialon-based phosphor particle may preferably be a Li-containing α-sialon-based phosphor having a composition represented by formula (1), wherein the aspect ratio of the primary particle as measured by the image analysis of the scanning electron micrograph is 3 or less and the length of the short axis is more than 3 μm. The upper limit of the short axis length is preferably 5 μm. Such a Li-containing α-sialon-based phosphor particle has high fluorescence intensity.

The Li-containing α-sialon-based phosphor powder may be characterized in that an α-sialon composition having the above-described Li content is employed, an amorphous silicon nitride powder and/or a nitrogen-containing silane compound are used as raw materials, and lithium oxide and/or a raw material capable of forming lithium oxide at a high temperature are added in excess at the production, and this powder can be obtained by weighing an amorphous silicon nitride powder and/or a nitrogen-containing silane compound, an Al source, a Li source and a Eu source to give the desired composition of the Li-containing α-sialon-based phosphor represented by formula (1), further adding and mixing an excess of Li oxide or precursor substance capable of becoming an oxide of Li by pyrolysis to the powder above, and firing the mixture in a nitrogen-containing inert gas atmosphere.

Figure 5:
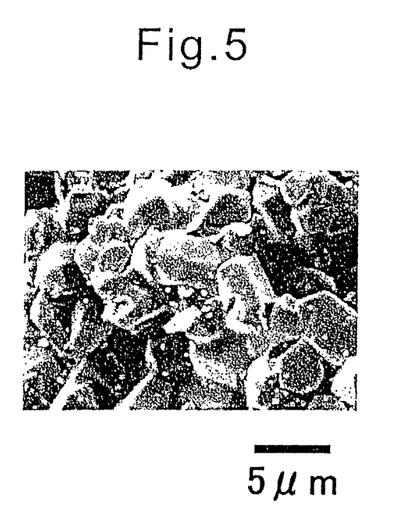
FIG. 5 is an SEM photograph of the powder obtained in Example 11.

FIG. 5 is a scanning electron microscope (SEM) photograph showing the state of powder after acid treatment of the Li-containing α-sialon-based phosphor particle obtained in Example 11. A part of secondary particles each formed by weakly fused primary particles is being observed.

FIG. 5 is a Li-containing α-sialon-based phosphor particle produced using raw materials where an oxide of Li or a precursor substance capable of becoming an oxide of Li by pyrolysis is added in excess to amorphous silicon nitride.

In FIG. 5, the form (automorphism) of the primary particle of Li-containing α-sialon-based phosphor can be distinctly confirmed. This powder contains a particle where the short axis of the primary particle is more than 3 μm.

The cause of producing a difference in the form and aggregation state of primary particles shown in FIG. 5 is described below. The nucleation and growth of a Li-containing α-sialon-based phosphor particle are thought to occur in a glass phase of Li—Al—Si—O—N system produced in raw materials in the course of temperature rising.

First, the reason for difference in the size of the primary particle is described below. In the case of using amorphous silicon nitride and/or a nitrogen-containing silane compound and not using an excess of lithium oxide, the size of the primary particle is small. On the other hand, in the case of using an excess of lithium oxide, the size of the primary particle is increased. This is attributable to a difference in the amount of glass phase. That is, when an excess of lithium oxide is used, the glass phase produced is increased. When the glass phase is increased, the degree of oversaturation of sialon in glass lowers and the amount of nuclei produced is decreased. In turn, the amount of raw materials supplied to one nucleus is increased, and the crystal size becomes large.

Next, the aggregation state of particles is described, although this is also described above. In the case of producing the phosphor powder by using crystalline silicon nitride, aggregation of the obtained phosphor powder aggressively occurs. On the other hand, when amorphous silicon nitride and/or a nitrogen-containing silane compound are used, the aggregation is reduced.

The amorphous silicon nitride and/or nitrogen-containing silane compound are an ultrafine powder having a particle diameter of approximately from several nm to 10 nm and, since this becomes a main raw material of sialon, the raw materials of sialon using amorphous silicon nitride is very bulky. In this powder, other raw materials are uniformly dispersed and come into contact with the ultrafine silicon nitride raw material. For this reason, a fine glass phase is considered to be uniformly formed at a low temperature. Moreover, due to bulkiness, the raw materials are in a state of being spatially separated and when nucleation and growth occur in such a glass phase, a powder reduced in aggregation results.

On the other hand, in the case of crystalline silicon nitride, the particle diameter is very large compared with the amorphous silicon nitride and/or nitrogen-containing silane compound and is about 0.2 μm. Since silicon nitride is large, the raw material does not dissolve in the glass phase and the reaction to sialon is considered to proceed in such a manner that glass covers the silicon nitride particle surface. Also, the bulk of the sialon raw material using crystalline silicon nitride is small and the glass phase cannot sufficiently enjoy spatial isolation unlike using amorphous silicon nitride and/or nitrogen-containing compound. If the reaction to sialon proceeds in such a state, a secondary particle in which primary particles are strongly fused/aggregated with each other is formed.

Lithium oxide added in excess and the raw material capable of producing lithium oxide at a high temperature may fulfill a role as a kind of flux but greatly differs from a general flux added for the purpose of making the crystal form uniform. The following two points are the reasons therefor.

(1) In the synthesis of the Li-containing α-sialon under atmospheric pressure, evaporation of Li may be increased. If the sialon is produced without replenishing Li, a Li-containing α-sialon largely lacking in lithium results. Such a sialon has many defects and is not preferred as a phosphor. To solve this problem, lithium oxide or a raw material capable of forming lithium oxide at a high temperature is added, whereby the lacking Li can be compensated for.

(2) An important feature of the Li-containing α-sialon-based phosphor is to emit fluorescence at a short wavelength as compared with the Ca-containing α-sialon-based phosphor. It has been also revealed by the studies this time that lithium oxide or a raw material capable of forming lithium oxide at a high temperature is effective for the short fluorescence wavelength above. This effect is considered to be brought about by the supply of oxygen from the added reagent.

As described above, lithium oxide and a raw material capable of producing lithium oxide at a high temperature may have an effect of substantially enhancing the fluorescence characteristics of the Li-containing α-sialon unlike a normal flux for merely controlling the primary particle morphology of the crystal.

Generally, in the case of producing a sialon phosphor, it is not preferred to use lithium oxide or a raw material capable of forming lithium oxide at a high temperature for the flux. The flux becomes an unnecessary component after obtaining a phosphor and is preferably removed after the synthesis. For this reason, a substance easily removable with water or an acid is usually selected. Considering this point, a halogen compound such as barium fluoride is selected. Lithium oxide is a hardly soluble component compared with a halogen compound and is difficult to remove after the synthesis and, therefore, this raw material is normally unemployable as a flux. Then, we used a fluoride as a flux, but use of a fluoride failed in producing a Li-containing α-sialon-based phosphor composed of primary particles with good morphology.

Moreover, the fluorescence intensity is reduced compared to adding lithium oxide or a raw material capable of forming lithium oxide at a high temperature. This is considered because evaporation of Li cannot be compensated for. From these studies, it has been concluded that only lithium oxide or a raw material capable of forming lithium oxide at a high temperature is suitable as a flux effective for the Li-containing α-sialon-based phosphor.

The method of adding lithium oxide or a raw material capable of forming lithium oxide at a high temperature is believed to be effective for all compositions of the Li-containing α-sialon, and the composition of the Li-containing α-sialon-based phosphor can be the above-described compositions.

The amount of lithium oxide or a raw material capable of forming lithium oxide at a high temperature added in excess over the Li-containing α-sialon-based phosphor powder raw material (i.e., the theoretical amount of lithium oxide to give Li-containing α-sialon to be produced) is, in terms of the metal Li amount, preferably from 0.1 to 1.25 mol per mol of the Li-containing α-sialon produced. If the amount added is less than 0.1 mol, the effect of increasing the crystal size cannot be sufficiently obtained, whereas if it exceeds 1.25 mol, the production of heterophase is increased to cause reduction in the fluorescence intensity. The amount added is more preferably from 0.15 to 0.8 mol.

A production process of the Li-containing α-sialon-based phosphor powder is described below. The Li-containing α-sialon-based phosphor powder can be obtained by weighing an amorphous silicon nitride powder and/or a nitrogen-containing silane compound, an AlN-containing substance working out to an aluminum source, a nitride, oxynitride or oxide of Li or a precursor substance capable of becoming an oxide of Li by pyrolysis, and a nitride, oxynitride or oxide of Eu or a precursor substance capable of becoming an oxide of Eu by pyrolysis, to give the desired Li-containing α-sialon, further adding and mixing an excess of Li oxide and/or an excess of a precursor substance capable of becoming an oxide of Li by pyrolysis to the powder above, and firing the mixture at 1,500 to 1,800° C. in an inert gas atmosphere under 0.08 to 0.1 MPa. As for the firing atmosphere, the firing is preferably performed in a nitrogen atmosphere under atmospheric pressure. In particular, by performing the synthesis in a nitrogen-containing inert gas atmosphere under atmospheric pressure, the production cost of the Li-containing α-sialon-based phosphor can be reduced.

The production process of the Li-containing α-sialon-based phosphor powder can be fundamentally the same as that described above except for using an amorphous silicon nitride powder and/or a nitrogen-containing silane compound and adding an excess of Li oxide or precursor substance capable of becoming an oxide of Li by pyrolysis in addition to the raw materials of the Li-containing α-sialon represented by formula (1).

An oxide of Li or a precursor substance capable of becoming an oxide of Li is added in excess, and examples of the precursor substance capable of becoming an oxide of Li by pyrolysis include respective metal salts such as carbonate, oxalate, citrate, basic carbonate and hydroxide.

The mixture of starting materials is fired at 1,500 to 1,800° C., preferably at 1,550 to 1,700° C., in a nitrogen-containing inert gas atmosphere under atmosphere pressure or reduced pressure to obtain the objective Li-containing α-sialon phosphor powder. Examples of the inert gas include helium, argon, neon and krypton, but such a gas may also be used by mixing it with a small amount of hydrogen gas. If the firing temperature is less than 1,500° C., an impracticably long period of heating is required for the production of the desired Li-containing α-sialon-based phosphor powder, and the proportion of Li-containing α-sialon-based phosphor phase in the powder produced is also reduced. If the firing temperature exceeds 1,800° C., there arises an undesirable problem that silicon nitride and sialon are sublimated and decomposed to produce free silicon. The firing time is preferably from 1 to 48 hours, In particular, a firing time of 1 to 24 hours at a firing temperature of 1,600 to 1,700° C. is most preferred, because a phosphor particle excellent in the particle shape and composition can be obtained.

The Li-containing α-sialon-based phosphor powder activated by a rare earth element emits fluorescence having a peak wavelength of 560 to 580 nm when excitation light is injected. The preferred rare earth element-activated Li-containing α-sialon-based phosphor powder is caused to emit fluorescence having a main wavelength of 570 to 574 nm by injecting excitation light.

Also, any of the rare earth element-activated Li-containing α-sialon-based phosphors is kneaded with a transparent resin such as epoxy resin and acrylic resin by a known method to produce a coating agent, and a light-emitting diode whose surface is coated with the coating agent can be used as a light-emitting device for various lighting devices.

In particular, a light emitting source in which the peak wavelength of excitation light is from 330 to 500 nm is suitable for the Li-containing α-sialon-based phosphor. In the ultraviolet region, the luminous efficiency of the Li-containing α-sialon-based phosphor is high and a light-emitting device having good performance can be fabricated. A high luminous efficiency is also obtained using a blue light source and by combining yellow fluorescence of the Li-containing α-sialon-based phosphor and blue excitation light, a light-emitting device giving good daytime white color or daylight color can be fabricated.

Furthermore, by combining a red phosphor of 600 to 650 nm for the adjustment of color tone, the emission color of daytime white color or daylight color can be controlled to fall in the warm bulb color region. The light-emitting device of such bulb color can be widely used for general domestic lighting.

Also, any of the rare earth element-activated Li-containing α-sialon-based phosphors can be applied to fabricate an image display device by using the Li-containing α-sialon-based phosphor. In this case, the above-described light-emitting device may be used but the Li-containing α-sialon-based phosphor can also be directly excited to emit light by using an excitation light such as electron beam, electric field and ultraviolet ray, for example, can be used on the principle like that of a fluorescent lamp. Even with such a light-emitting device, an image display device can be fabricated.

EXAMPLES

Our phosphors, devices and methods are described in greater detail below by referring to specific examples.

Examples 1 to 8

A lithium carbonate powder, a lithium nitride powder, a europium oxide powder, an aluminum nitride powder and an amorphous silicon nitride powder obtained by reacting silicon tetrachloride and ammonia, or crystalline silicon nitride having a specific surface area of about 9.2 m$^2$/g were weighed to give the composition in Table 1. In Table 1, the raw material composition is expressed in mol %, and in Table 2, the raw material composition is expressed in wt %. A nylon ball for stirring and the weighed powders were put in a vessel and mixed by a vibration mill for 1 hour in a nitrogen atmosphere. After the mixing, the resulting powder was taken out and filled in a boron nitride-made crucible. At this time, the filing density was about 0.5 g/cm$^3$ when using crystalline silicon nitride and about 0.18 g/cm$^3$ when using amorphous silicon nitride. The crucible was set in a resistance heating furnace and heated in a nitrogen gas flow atmosphere under atmospheric pressure according to a temperature-rising schedule of holding the temperature at from room temperature to 1,000° C. for 1 hour and at from 1,000 to 1,250° C. for 2 hours and raising the temperature from 1,250° C. to the objective temperature shown in Table 3 at 200° C./h, whereby a phosphor powder was obtained. This powder was obtained as a lump due to weak sintering and, therefore, lightly ground in an agate mortar until obtaining a powder free from a large lump and after performing an acid treatment by dipping and stirring the powder in a 2 N nitric acid solution for 5 hours, the resulting powder was dried at a temperature of 110° C. for 5 hours to obtain a powder.

The X-ray diffraction pattern of the powder obtained was measured, and identification of the crystal phase was performed. As a result, in all Examples, the powder was confirmed to be substantially a Li-containing α-sialon-based phosphor. Subsequently, the compositional analysis of the powder obtained was performed. Oxygen and nitrogen contained in the Li-containing α-sialon-based phosphor were analyzed in an oxygen-nitrogen simultaneous analyzer manufactured by LECO. As for Li, the sample was acidolyzed with nitric acid and hydrofluoric acid under pressure, sulfuric acid was added thereto, the resulting mixture was concentrated by heating until a white fume was generated, hydrochloric acid was added thereto and after dissolving under heating, the resulting solution was quantitatively analyzed by the ICP-AES method using Model SPS5100 manufactured by SII Nanotechnology. As for Si, the sample was melted by overheating with sodium carbonate and boric acid and then dissolved with hydrochloric acid, and the obtained solution was quantitatively analyzed in accordance with the coagulation gravimetric method. As for Li and Eu, the filtrate obtained in the pretreatment of the quantitative analysis of Si was collected and quantitatively analyzed by ICP-AES. The results are shown in Table 3, These powders were further evaluated for the peak wavelength and peak intensity of the fluorescence by using FP-6500 with an integrating sphere manufactured by JASCO Corporation. Incidentally, the excitation wavelength of the fluorescence spectrum was set to 450 nm. The results are shown in Table 4. 2 was used as the valence a of Eu when calculating δ.

With respect to Example 2 using amorphous silicon nitride as a raw material and Example 6 using crystalline silicon nitride, the particle morphology was observed by scanning electron microscopes (SEM) S4800 manufactured by Hitachi High-Technologies Corporation and JSM-7000F manufactured by JEOL Ltd. The observation was performed for the particle morphology after acid treatment (FIGS. 1A and 1B) and then, performed for the classified product obtained by removing extremely large particles and extremely small particles from the powder so that the powder can be used as a phosphor (FIGS. 2A, 2B, 3A and 3B). Specifically, the powder was passed through a sieve of 20 μm and fine particles were removed by the powder-to-water ratio.

Based on SEM photographs, the area of particles in each photograph was determined using an image analysis software Image J, the equivalent-circle particle diameter was determined from the area, and the average particle diameter was determined. The results are shown in Table 4. Also, about 20 visually average primary particles were extracted and the average of their particle diameters was determined, as a result, the obtained value substantially agreed with the average equivalent-circle diameter. The average particle diameter of the Li-containing α-sialon using amorphous silicon nitride was from 1 to 3 μm. The aspect ratio was 2 or less in all Examples. In the powder using amorphous silicon nitride for the raw material, a primary powder could be clearly distinguished, but in the powder using crystalline silicon nitride, a secondary particle where primary particles are densely fused/aggregated was formed, and the image analysis was difficult. Therefore, about 20 visually average primary particles were extracted, and the average of their particle diameters was determined. The results are shown in Table 4. The primary particle diameter was about 0.5 μm and by far smaller than that when using amorphous silicon nitride.

Also, with respect to particles in the analysis region, the existence ratio of particles of 0.8 μm or more was determined. The area of all particles in the measurement region and the area of particles of 0.8 μm or more were determined, and the ratio therebetween was calculated. The results are shown in Table 4. In all samples, the area ratio was 70% or more.

The classified product of Example 2 was measured for the particle size distribution by using a laser diffraction/scattering particle size distribution measuring apparatus, LA-910, manufactured by Horiba Ltd. The measuring method was as follows. A dispersion medium containing 0.03 wt % of SN Dispersant produced by San Nopco Limited was put into a flow cell, and a blank measurement was performed. Subsequently, the sample was added to a dispersion medium having the same composition and ultrasonically dispersed for 60 minutes. The measurement was performed by adjusting the amount of the sample so that the transmittance of the solution became from 70 to 95%. The measurement results were corrected by the previously measured blank measurement results to determine the particle size distribution. FIGS. 2A and 3A show the SEM photograph of this powder. FIG. 4A shows the results of the particle size distribution measurement. The frequency distribution curve exhibited a good one-peak curve. D10, D50 and D90 are shown in Table 4. The specific surface area of this powder was measured by FlowSorb Model 2300 manufactured by Shimadzu Corporation and found to be 1.52 $m^2/g$. The classified product of Example 4 was also measured for D10, D50 and D90 and exhibited a good one-peak curve as the frequency distribution curve.

Furthermore, the particle size distribution measurement was performed with respect to Example 6. FIGS. 2B and 3B show the SEM photograph of this powder. FIG. 4B shows the measurement results of the particle size distribution. The frequency distribution curve exhibited a two-peak curve. D10, D50 and D90 are shown in Table 4. The specific surface area of this powder was measured by FlowSorb Model 2300 manufactured by Shimadzu Corporation and found to be 2.50 $m^2/g$. The classified product of Example 7 was also measured for D10, D50 and D90 and exhibited a two-peak curve as the frequency distribution curve. D90 of Example 7 exceeded 20 μm and this is considered to result because fine particles and large particles were aggregated during measurement.

When a Li-containing α-sialon-based phosphor powder was produced using crystalline silicon nitride, a powder composed of a secondary particle resulting from fusion/aggregation of small primary particles is obtained, and when this powder is pulverized to provide a phosphor, fine particles as the secondary particle debris and large secondary particles are allowed to exist. With such powder, scattering is increased due to fine particles, decreasing the fluorescence intensity, and the particle size distribution is greatly reduced.

Comparative Example 1

A phosphor powder was produced according to the formulation shown in Table 1 by the same method as in Example 1. Furthermore, the identification and compositional analysis of the crystal phase were performed by the same method as in Example 1. As a result of analysis of the crystal phase, the powder obtained was a powder composed of a Li-containing α-sialon-based phosphor single phase. The analyzed composition is shown in Table 3. The x value of the Li-containing α-sialon-based phosphor was 0.39. The fluorescence intensity of this Li-containing α-sialon-based phosphor powder was low. These results reveal that when the x-value is less than 0.45, good fluorescence intensity cannot be obtained.

Comparative Example 2

A phosphor powder was produced according to the formulation shown in Table 1 by the same method as in Example 1. Furthermore, the identification and compositional analysis of the crystal phase were performed by the same method as in Example 1, As a result of analysis of the crystal phase, the powder obtained was a powder composed of a Li-containing α-sialon-based phosphor and slight heterophase. The analyzed composition is shown in Table 3. Incidentally, the powder contained the heterophase in a very small proportion and was composed mostly of a Li-containing α-sialon phosphor and therefore, the calculation was performed in disregard of the heterophase. The x value and δ of the Li-containing α-sialon-based phosphor were 0.9 and −0.2, respectively. The fluorescence intensity of this Li-containing α-sialon-based phosphor powder was low. These results reveal that when δ is less than 0, good fluorescence intensity cannot be obtained.

Comparative Example 3

A phosphor powder was produced according to the formulation shown in Table 1 by the same method as in Example 1 except for using crystalline silicon nitride having a specific surface area of about 9.2 m²/g as the silicon nitride raw material and subjected to acid washing in the same manner. Furthermore, the identification and compositional analysis of the crystal phase were performed by the same method as in Example 1. As a result of analysis of the crystal phase, the powder obtained was a powder composed of a Li-containing α-sialon-based phosphor and slight heterophase. The analyzed composition is shown in Table 3. Incidentally, the powder contained the heterophase in a very small proportion and was composed mostly of a Li-containing α-sialon phosphor and, therefore, the calculation was performed in disregard of the heterophase. The x value and δ of the Li-containing α-sialon-based phosphor were 0.82 and 0.0, respectively. The fluorescence intensity ratio stood at the small value of 68.

Example 9

The phosphor of Example 2 and epoxy resin were mixed in a weight ratio of 20:100 to produce a phosphor paste. This paste was coated on a blue light-emitting diode (wavelength: 470 nm) fixed to an electrode and heated at 120° C. for 1 hour and further at 150° C. for 12 hours to cure the epoxy resin. The obtained light-emitting diode was lit, and the light was confirmed to be white light of daylight color.

Example 10

The phosphor of Example 2 and a separately prepared red phosphor $CaAlSiN_3$ were mixed to adjust the color tone of the phosphor. The results are shown in Table 5. White LEDs ranging from daylight color to bulb color could be produced by combining a blue LED according to the change in the color tone shown in Table 5.

TABLE 1

|  | $Li_2CO_3$ (mol %) | $Li_3N$ (mol %) | $Eu_2O_3$ (mol %) | AlN (mol %) | $Si_3N_4$ (mol %) |
|---|---|---|---|---|---|
| Example 1 | 13.41 | 0.89 | 0.54 | 46.18 | 38.98 |
| Example 2 | 13.41 | 0.89 | 0.54 | 46.18 | 38.98 |
| Example 3 | 15.09 | 1.26 | 0.48 | 51.09 | 32.08 |
| Example 4 | 15.80 | 1.45 | 0.46 | 53.21 | 29.08 |
| Example 5 | 13.41 | 0.89 | 0.54 | 46.18 | 38.98 |
| Example 6 | 13.41 | 0.89 | 0.54 | 46.18 | 38.98 |
| Example 7 | 13.41 | 0.89 | 0.54 | 46.18 | 38.98 |
| Example 8 | 9.75 | 0.39 | 0.65 | 35.49 | 53.73 |
| Comparative Example 1 | 9.75 | 0.39 | 0.65 | 35.49 | 53.73 |
| Comparative Example 2 | 0.59 | 12.88 | 0.78 | 22.73 | 63.03 |
| Comparative Example 3 | 0.63 | 11.50 | 0.84 | 17.02 | 70.00 |

TABLE 2

|  | $Li_2CO_3$ (wt %) | $Li_3N$ (wt %) | $Eu_2O_3$ (wt %) | AlN (wt %) | $Si_3N_4$ (wt %) |
|---|---|---|---|---|---|
| Example 1 | 11.56 | 0.36 | 2.20 | 22.09 | 63.79 |
| Example 2 | 11.56 | 0.36 | 2.20 | 22.09 | 63.79 |
| Example 3 | 14.08 | 0.55 | 2.15 | 26.43 | 56.79 |
| Example 4 | 15.28 | 0.66 | 2.12 | 28.55 | 53.39 |
| Example 5 | 11.56 | 0.36 | 2.20 | 22.09 | 63.79 |
| Example 6 | 11.56 | 0.36 | 2.20 | 22.09 | 63.79 |
| Example 7 | 11.56 | 0.36 | 2.20 | 22.09 | 63.79 |
| Example 8 | 7.24 | 0.14 | 2.30 | 14.61 | 75.72 |
| Comparative Example 1 | 7.24 | 0.14 | 2.30 | 14.61 | 75.72 |
| Comparative Example 2 | 0.41 | 4.26 | 2.60 | 8.84 | 83.89 |
| Comparative Example 3 | 0.41 | 3.56 | 2.63 | 6.20 | 87.21 |

TABLE 3

|  | Silicon Nitride Species | Firing Temperature (° C.) | Firing Time (h) | x | y | m | n | x/m | n + δ | δ |
|---|---|---|---|---|---|---|---|---|---|---|
| Example 1 | amorphous | 1700 | 1 | 0.82 | 0.02 | 1.58 | 1.50 | 0.52 | 2.22 | 0.72 |
| Example 2 | amorphous | 1650 | 3 | 0.98 | 0.01 | 1.14 | 2.14 | 0.86 | 2.28 | 0.14 |
| Example 3 | amorphous | 1650 | 3 | 1.13 | 0.05 | 1.57 | 2.27 | 0.72 | 2.61 | 0.34 |
| Example 4 | amorphous | 1700 | 3 | 1.08 | 0.02 | 1.76 | 2.16 | 0.61 | 2.80 | 0.64 |
| Example 5 | crystalline | 1700 | 3 | 0.71 | 0.08 | 2.05 | 0.56 | 0.35 | 1.74 | 1.18 |
| Example 6 | crystalline | 1650 | 3 | 0.84 | 0.04 | 0.96 | 1.50 | 0.88 | 1.54 | 0.04 |
| Example 7 | crystalline | 1600 | 3 | 0.97 | 0.03 | 1.09 | 2.04 | 0.89 | 2.10 | 0.06 |
| Example 8 | amorphous | 1700 | 3 | 0.45 | 0.05 | 1.08 | 0.79 | 0.42 | 1.32 | 0.53 |
| Comparative Example 1 | crystalline | 1700 | 3 | 0.39 | 0.10 | 1.12 | 0.29 | 0.35 | 0.82 | 0.53 |
| Comparative Example 2 | crystalline | 1700 | 3 | 0.90 | 0.10 | 0.90 | 0.65 | 1.00 | 0.45 | −0.20 |
| Comparative Example 3 | crystalline | 1650 | 3 | 0.82 | 0.05 | 0.92 | 0.30 | 0.89 | 0.30 | 0.00 |

TABLE 4

|  | Average Particle Diameter (μm) | Average Aspect Ratio | Existence Area (%) | D10 (μm) | D50 (μm) | D90 (μm) | Fluorescence Peak Wavelength (nm) | Fluorescence Intensity Ratio (%) |
|---|---|---|---|---|---|---|---|---|
| Example 1 | 1.3 | 1.3 | 78.5 | — | — | — | 578.0 | 238 |
| Example 2 | 1.4 | 1.4 | 70.4 | 2.6 | 4.9 | 9.3 | 571.0 | 298 |
| Example 3 | 2.2 | 1.4 | 95.0 | — | — | — | 572.5 | 321 |
| Example 4 | 2.8 | 1.3 | 95.6 | 3.2 | 7.2 | 14.8 | 570.0 | 251 |
| Example 5 | 0.46 | — | — | — | — | — | 580.0 | 100 |
| Example 6 | 0.6 | — | — | 0.89 | 3.7 | 17.2 | 578.5 | 120 |
| Example 7 | 0.51 | — | — | 1.2 | 15.8 | 25.5 | 573.0 | 196 |
| Example 8 | 1.6 | 1.3 | 97.2 | — | — | — | 574.5 | 161 |

TABLE 4-continued

|  | Average Particle Diameter (μm) | Average Aspect Ratio | Existence Area (%) | D10 (μm) | D50 (μm) | D90 (μm) | Fluorescence Peak Wavelength (nm) | Fluorescence Intensity Ratio (%) |
|---|---|---|---|---|---|---|---|---|
| Comparative Example 1 | 0.45 | — | — | — | — | — | 574.5 | 98 |
| Comparative Example 2 | 0.4 | — | — | — | — | — | 586.5 | 38 |
| Comparative Example 3 | 0.4 | — | — | — | — | — | 580.0 | 68 |

TABLE 5

| | Mixing Ratio of Phosphor Powders (wt %) | | Color Tone | |
|---|---|---|---|---|
| | Li-Containing α-Sialon-Based Phosphor | Red Phosphor | x | y |
| Example 10-1 | 100 | 0 | 0.4489 | 0.5273 |
| Example 10-2 | 99 | 1 | 0.4687 | 0.5070 |
| Example 10-3 | 97 | 3 | 0.4946 | 0.4825 |
| Example 10-4 | 95 | 5 | 0.5508 | 0.4315 |

Example 11

A lithium carbonate powder, a europium oxide powder, an aluminum nitride powder, an aluminum oxide powder and an amorphous silicon nitride powder obtained by reacting silicon tetrachloride and ammonia were weighed to give x=0.85, y=0.2, m=1.25 and n=1.0, and furthermore, as an excess additive, lithium carbonate was added in an amount of, in terms of metal Li, 0.63 mol per mol of Li-containing α-sialon. A nylon ball for stirring and the weighed powders were put in a vessel and mixed by a vibration mill for 1 hour in a nitrogen atmosphere. After the mixing, the resulting powder was taken out and filled in a boron nitride-made crucible. At this time, the filing density was about 0.18 g/cm$^3$. The crucible was set in a heat resistant furnace and heated by holding the temperature at from room temperature to 1,000° C. for 1 hour and at from 1,000 to 1,250° C. for 2 hours and raising the temperature from 1,250° C. to 1,600° C. at 200° C./h. The holding time was set to 3 hours, and a phosphor powder was obtained. This powder was obtained as a lump due to weak sintering and, therefore, the powder was lightly ground in an agate mortar until obtaining a powder free from a large lump and then subjected to an acid treatment by dipping and stirring the powder in a 2 N nitric acid solution for 5 hours. The resulting powder was dried at a temperature of 110° C. for 5 hours.

The powder obtained was analyzed for the composition by the same method as in Example 1, as a result, x=0.64, y=0.10, m=0.91, n=2.12, x/m=0.70 and δ=0.07.

Furthermore, the particle morphology of the powder obtained was observed using a scanning electron microscope (SEM), JSM-7000F, manufactured by JEOL Ltd. FIG. 5 shows the results. As shown in FIG. 5, a Li-containing α-sialon-based phosphor powder containing a Li-containing α-sialon phosphor particle which is a primary particle such that the average aspect ratio of particles of 3 μm or more is 1.3 and the length of short axis is 3.3 i.e., the length of the short axis is larger than 3 μm, could be obtained.

The X-ray diffraction pattern of this powder was measured to identify the crystal phase. Incidentally, Kα of Cu was used as the X-ray source. As a result, the principal peak was confirmed to be Li-containing α-sialon. An X-ray was precisely scanned to determined the lattice constant and the results were hexagonal, a=7.812 Å and c=5,666 Å.

Fluorescence characteristics are described below. Envisaging use of the phosphor in practice, a classified product obtained by removing extremely large particles and extremely small particles was employed as the sample. More specifically, large particle lumps were removed by passing the powder through a sieve of 20 μm, and extremely fine particles were further removed at the powder-to-water ratio.

The fluorescence characteristics were measured using FP-6500 with an integrating sphere manufactured by JASCO Corporation. The result was 270% with the same scale as in Table 4.

Example 12

Raw materials were weighed and mixed to give the same composition as in Example 2 except for using, as the raw material, silicon diimide in place of amorphous silicon nitride powder. The mixed powder was filled in a silicon nitride crucible. At this time, the filing density was 0.09 g/cm$^3$. The crucible was set in a resistance heating furnace and heated in a nitrogen gas flow atmosphere under atmospheric pressure according to a temperature-rising schedule of holding the temperature at from room temperature to 800° C. for 1 hour, at from 800 to 1,000° C. for 2 hours and at from 1,000 to 1,250° C. for 2 hours and raising the temperature from 1,250° C. to 1,650° C. at 200° C./h, whereby a phosphor powder was obtained. The powder obtained was treated by the same method as in Example 2 and subjected to analysis of the composition. The results were x=0.90, y=0.03, m=1.13, n=2.23, x/m=0.80 and δ=0.17. The fluorescence wavelength was 572 nm, and the fluorescence intensity was 293% when expressed by the intensity ratio of Table 4.

The invention claimed is:

1. A process of producing an Li-containing α-sialon-based phosphor represented by formula (1):

$$Li_xEu_ySi_{12-(m+n)}Al_{(m+n)}O_{n+\delta}N_{16-n-\delta} \quad (1)$$

wherein, assuming that average valence of Eu is a, x+ya+δ=m; 0.45≤x<1.2, 0.001≤y≤0.2, 0.9≤m≤2.5, 0.5≤n≤2.4, and δ>0;

the process comprising:
i) weighing and mixing
  a) a silicon nitride powder and/or a nitride-containing silane compound,
  b) an aluminum source containing at least aluminum nitride,
  c) a nitride, oxynitride or oxide of Eu or a precursor substance capable of becoming an oxide of Eu by pyrolysis, and
  d) a nitride, oxynitride or oxide of Li or a precursor substance capable of becoming an oxide of Li by pyrolysis, in such amounts to produce a composition of the Li-containing α-sialon-based phosphor represented by formula (1) provided that lithium is contained in an amount in excess over a theoretical amount of Li in the Li-containing α-sialon-based phosphor represented by formula (1) by 0.1 to 1.25 mole per 1 mole of the Li-containing α-sialon-based phosphor, and ii) firing a mixture obtained by said mixing at 1,500 to 1,800° C. in a nitrogen-containing inert gas atmosphere under atmospheric pressure, to obtain the Li-containing α-sialon-based phosphor represented by formula (1).

2. The process of claim 1, wherein the Li-containing α-sialon-based phosphor after said firing is subjected to acid washing.

3. The process of claim 1, wherein a powder of the Li-containing α-sialon-based phosphor is produced in which an average aspect ratio of primary particles as measured by image analysis of a scanning electron micrograph is 2 or less and average particle diameter $D_{particle}$ of the primary particles is 1 to 3.0 μm.

4. The A process of producing an Li-containing α-sialon-based phosphor represented by formula (1):

$$Li_xEu_ySi_{12-(m+n)}Al_{(m+n)}O_{n+\delta}N_{16-n-\delta} \quad (1)$$

wherein, assuming that average valence of Eu is a, $x+ya+\delta=m$; $0.45 \leq x < 1.2$, $\leq 0.001 \leq y \leq 0.2$, $0.9 \leq m \leq 2.5$, $0.5 \leq n \leq 2.4$, and $\delta > 0$;

the process comprising:
i) weighing and mixing
a) an amorphous silicon nitride powder and/or a nitride-containing silane compound,
b) an aluminum source containing at least aluminum nitride,
c) a nitride, oxynitride or oxide of Eu or a precursor substance capable of becoming an oxide of Eu by pyrolysis, and
d) a nitride, oxynitride or oxide of Li or a precursor substance capable of becoming an oxide of Li by pyrolysis, in such amounts to produce a composition of the Li-containing α-sialon-based phosphor represented by formula (1) provided that lithium is contained in an amount in excess over a theoretical amount of Li in the Li-containing α-sialon-based phosphor represented by formula (1) by 0.1 to 1.25 mole per 1 mole of the Li-containing α-sialon-based phosphor, and ii) firing a mixture obtained by said mixing at 1,500 to 1,800° C. in a nitrogen-containing inert gas atmosphere under atmospheric pressure to obtain a powder of the Li-containing α-sialon-based phosphor in which an aspect ratio of primary particles as measured by image analysis of a scanning electron microscope is 3 or less and a length of short axis of the primary particles is more than 3 μm.

5. The process of claim 4, wherein the Li-containing α-sialon-based phosphor after said firing is subjected to acid washing.

* * * * *

UNITED STATES PATENT AND TRADEMARK OFFICE
CERTIFICATE OF CORRECTION

PATENT NO.        : 9,464,226 B2                                     Page 1 of 1
APPLICATION NO.   : 14/217816
DATED             : October 11, 2016
INVENTOR(S)       : Sakata et al.

It is certified that error appears in the above-identified patent and that said Letters Patent is hereby corrected as shown below:

In the claims

In column 25, at line 23, claim 4, please delete "The" before "A process".

Signed and Sealed this
Twenty-second Day of November, 2016

Michelle K. Lee
*Director of the United States Patent and Trademark Office*